(12) United States Patent
Thiele et al.

(10) Patent No.: US 9,076,805 B2
(45) Date of Patent: Jul. 7, 2015

(54) CURRENT SENSE TRANSISTOR WITH EMBEDDING OF SENSE TRANSISTOR CELLS

(75) Inventors: Steffen Thiele, Munich (DE); Andreas Meiser, Sauerlach (DE); Markus Zundel, Egmating (DE)

(73) Assignee: Infineon Technologies AG, Neubiberg (DE)

(*) Notice: Subject to any disclaimer, the term of this patent is extended or adjusted under 35 U.S.C. 154(b) by 249 days.

(21) Appl. No.: 13/549,463

(22) Filed: Jul. 14, 2012

(65) Prior Publication Data
US 2014/0015046 A1  Jan. 16, 2014

(51) Int. Cl.
H01L 29/78 (2006.01)
H01L 23/58 (2006.01)
H01L 29/417 (2006.01)
H03K 17/082 (2006.01)
H01L 27/12 (2006.01)
G01R 19/00 (2006.01)

(52) U.S. Cl.
CPC .............. *H01L 23/58* (2013.01); *H01L 27/124* (2013.01); *G01R 19/0092* (2013.01); *H01L 29/41741* (2013.01); *H01L 29/41766* (2013.01); *H01L 29/7813* (2013.01); *H01L 29/7815* (2013.01); *H03K 17/0822* (2013.01); *H03K 2217/0027* (2013.01); *H01L 2924/0002* (2013.01)

(58) Field of Classification Search
USPC .................................................. 257/401, 341
IPC ..................................................... H01L 27/124
See application file for complete search history.

(56) References Cited

U.S. PATENT DOCUMENTS

| | | | | |
|---|---|---|---|---|
| 5,691,555 A * | 11/1997 | Zambrano et al. | ............. | 257/332 |
| 7,629,635 B2 * | 12/2009 | Kaibara et al. | ................ | 257/295 |
| 7,800,171 B2 | 9/2010 | Von Borcke et al. | | |
| 8,062,954 B2 | 11/2011 | Poelzl | | |
| 8,064,235 B2 * | 11/2011 | Shiraishi et al. | ............... | 363/144 |
| 8,411,471 B2 * | 4/2013 | Willmeroth et al. | ........ | 363/21.12 |
| 8,431,998 B2 * | 4/2013 | Miyata | ........................... | 257/355 |
| 8,633,723 B2 * | 1/2014 | Takeuchi | .................... | 324/750.3 |
| 2001/0020732 A1 | 9/2001 | Deboy et al. | | |
| 2009/0218683 A1 * | 9/2009 | Satou et al. | .................... | 257/723 |
| 2009/0283826 A1 * | 11/2009 | Shea et al. | ..................... | 257/336 |
| 2011/0084334 A1 * | 4/2011 | Lin et al. | ....................... | 257/331 |
| 2012/0068296 A1 * | 3/2012 | Takaya et al. | ................. | 257/467 |
| 2014/0001539 A1 * | 1/2014 | Yagi et al. | ..................... | 257/328 |

FOREIGN PATENT DOCUMENTS

DE  10 2008 024 949 B3  12/2009
DE  10 2006 048 625 B4  4/2011

* cited by examiner

*Primary Examiner* — Eugene Lee
(74) *Attorney, Agent, or Firm* — Slater & Matsil, L.L.P.

(57) ABSTRACT

A semiconductor device a field of transistor cells integrated in a semiconductor body. A number of the transistor cells forming a power transistor and at least one of the transistor cells forming a sense transistor. A first source electrode is arranged on the semiconductor body electrically connected to the transistor cell(s) of the sense transistor but electrically isolated from the transistor cells of the power transistor. A second source electrode is arranged on the semiconductor body and covers the transistor cells of both the power transistor and the sense transistor, and at least partially covering the first source electrode in such a manner that the second source electrode is electrically connected only to the transistor cells of the power transistor but electrically isolated from the transistor cells of the sense transistor.

23 Claims, 6 Drawing Sheets

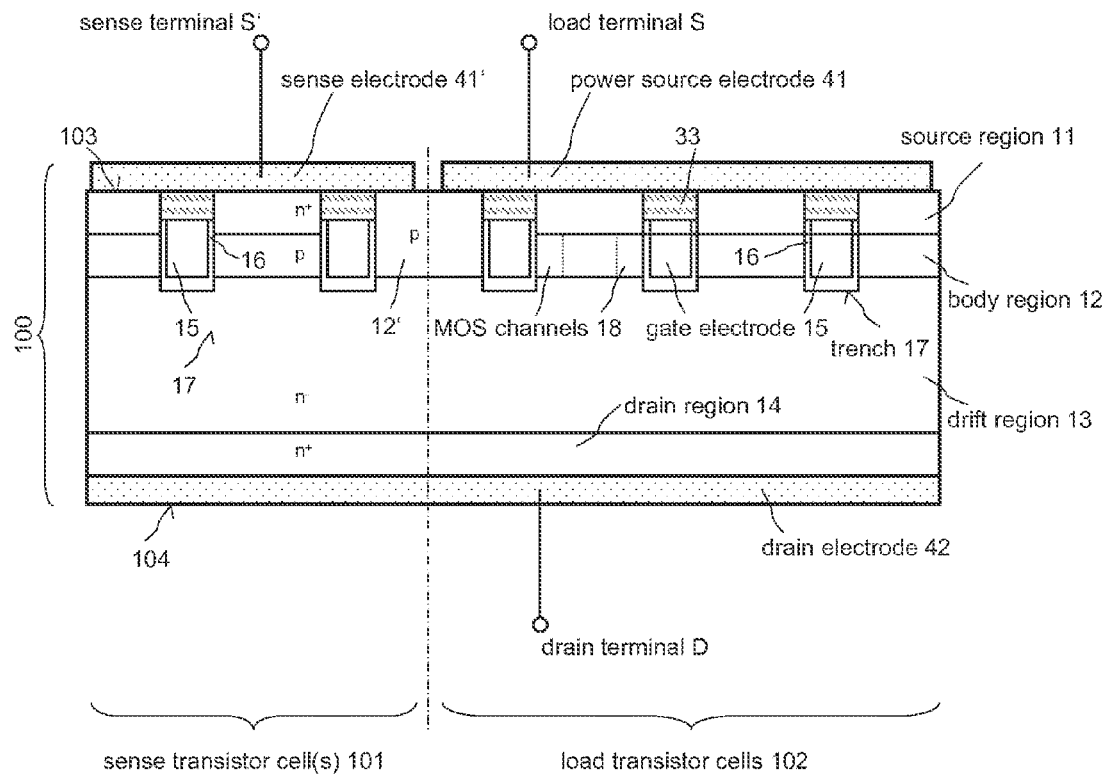
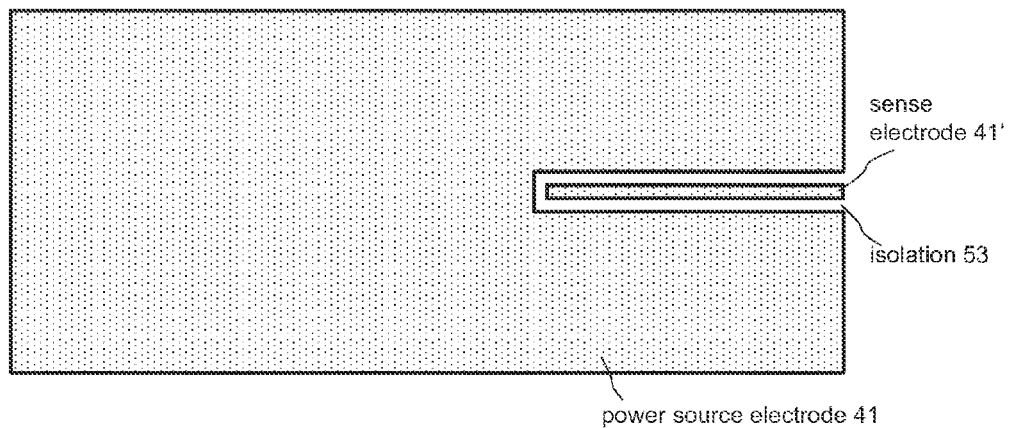
Fig. 1

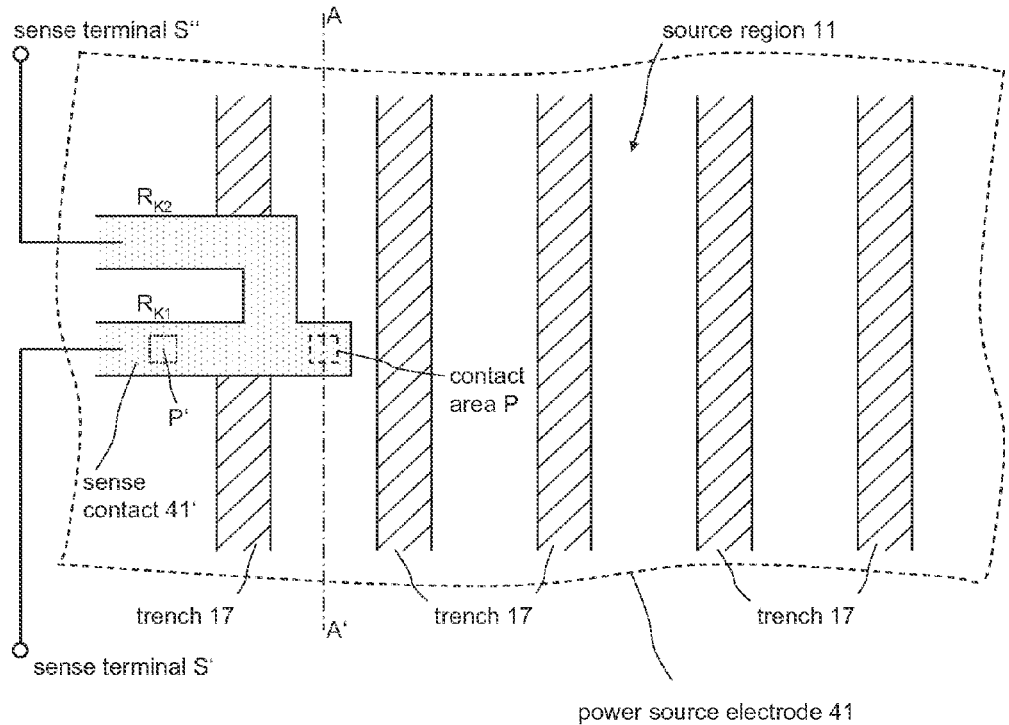
Fig. 5
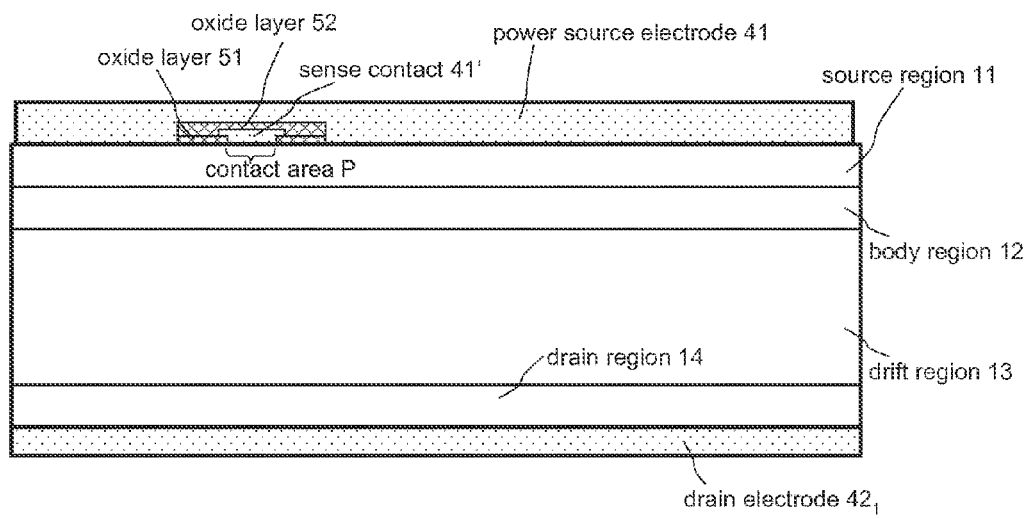
Fig. 6   (section A–A')

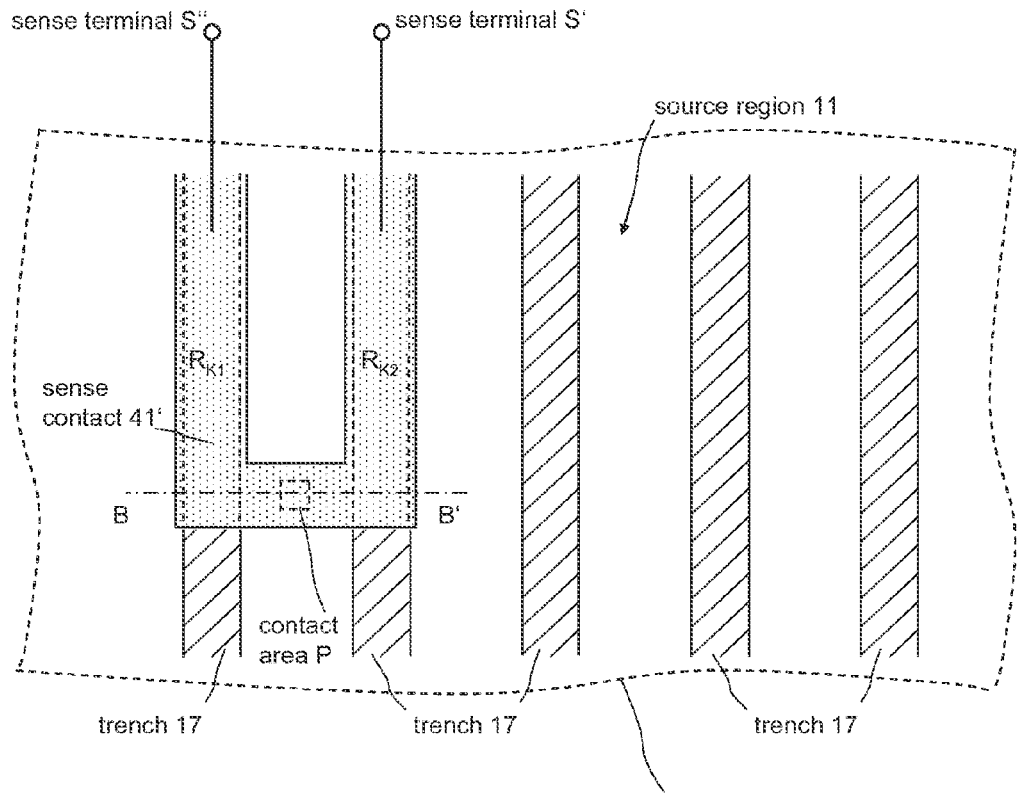
Fig. 7
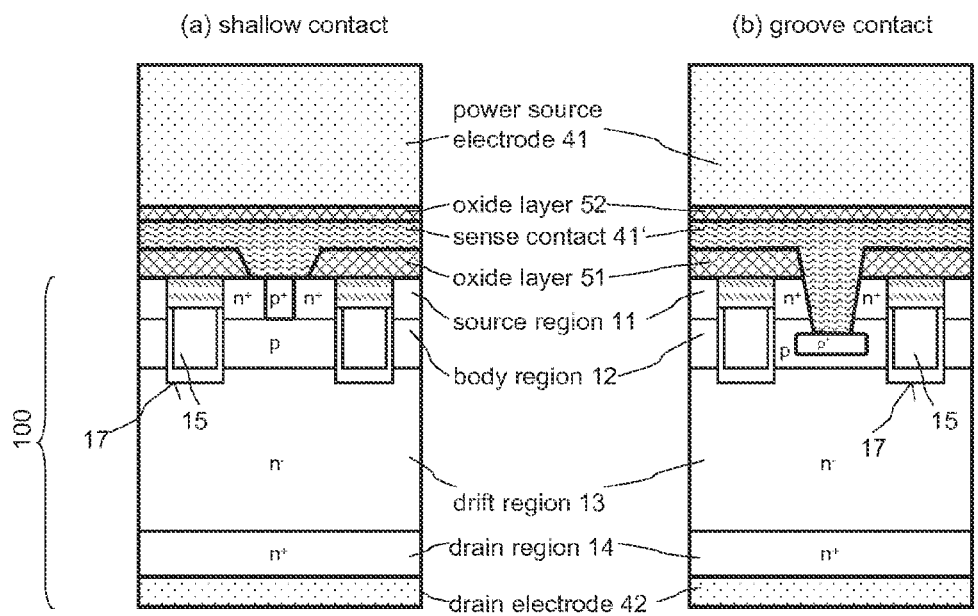
Fig. 8   (section B-B')

US 9,076,805 B2

CURRENT SENSE TRANSISTOR WITH EMBEDDING OF SENSE TRANSISTOR CELLS

TECHNICAL FIELD

The present invention relates to the field of current sensing of transistor load currents using so-called sense-transistors.

BACKGROUND

Current sensing circuits using so-called current sensing transistors (or "sense FETs") have been commonly used for years. Such current sensing techniques may be especially useful when measuring the load current of power field effect transistors (power FETs) which are composed of a plurality of transistor cells as illustrated, for example, in U.S. patent publication US 2001/0020732 A1. Such power field effect transistors have a common drain region for all transistors cells composing the power transistor component. The common drain region is connected by one drain electrode arranged on the back-side of a wafer whereas the source region and the respective source electrodes are contacted on the front-side of the wafer and connected in parallel. The source electrode of one transistor cell (referred to as "sense cell") may be connected separately from the source electrode carrying the load current to tap a current signal (referred to as "sense current") that is representative of the load current flowing through the remaining of the plurality of transistor cells which form the load transistor. Of course a few transistor cells may be connected in parallel to form the sense transistor.

In a circuit arrangement including a load transistor/sense transistor pair the source current of the sense transistor (i.e., the sense current) is directly proportional to the source current of the load transistor (i.e., the load current) whereby the factor of proportionality results from the ratio of the current conducting area of the load transistor and the current conducting area of the sense transistor which is (at least approximately) equivalent to the ratio of the number of transistor cells forming the load transistor and, respectively, the sense transistor.

The proportionality condition mentioned above is only met when both transistors (load transistor and sense transistor) exactly operate in the same operating point, i.e., when both transistors are supplied with the same gate-source voltage and are exposed to the same drain-source voltage. A number of circuitry is known which may be applied to ensure that both transistors operate in the same operating point. Just to give an example, for common drain MOS technologies an operational amplifier may be used to set the source-voltage of the sense transistor to match the source-voltage of the load transistor. Due to the common drain electrode an equal drain-source-voltage is achieved. Additionally, the gate electrodes of sense transistor and load transistor are connected so as to provide the same gate-source voltage to both transistors.

Although the sense transistor and load transistor operate in the same operating point due to appropriate circuitry, further undesired side effects and interactions between the both transistors may deteriorate the strict proportionality between the respective source currents. For example, the homogeneous drain current density is to be ensured throughout the transistor cells (of both transistors). An inhomogeneous drain current flow may result in internal transverse currents thus distorting the strict proportional relationship between the source currents of the sense transistor and the load transistor, respectively.

In view of the above there is a general need for improved current sensing circuit arrangements which (at least partially) solve or alleviate the problems arising when using known sense transistor circuits.

SUMMARY OF THE INVENTION

A semiconductor device is disclosed. In accordance with one example of the present invention the semiconductor device comprises a semiconductor body and a field of transistor cells integrated in the semiconductor body. A plurality of the transistor cells form a power transistor and at least one of the transistor cells form a sense transistor. A first source electrode is arranged on the semiconductor body which is electrically connected to the transistor cell(s) of the sense transistor but electrically isolated from the transistor cells of the power transistor. A second source electrode is arranged on the semiconductor body which covers the transistor cells of both, the power transistor and the sense transistor, and at least partially covers the first source electrode in such a manner that the second source electrode is electrically connected only to the transistor cells of the power transistor but electrically isolated from the transistor cells of the sense transistor.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 1a is a cross sectional view of a few transistor cells of a trench transistor wherein some cells have a separate source electrode to form a sense transistor;

FIG. 1b is a top view of a load transistor/sense transistors arrangement;

FIG. 5 is a top view of the example of FIG. 4 wherein the source metallization of the power transistor is transparent to illustrate how the source of the sense transistor is connected;

FIG. 6 is a cross sectional view of the example of FIG. 4, the cross section being perpendicular to that of FIG. 4;

FIG. 7 is an alternative to the example shown in FIG. 5;

FIG. 8 is a cross sectional view of the example of FIG. 5 perpendicular to the trenches, two alternative contact examples are illustrated in diagram (a) (which can be referred to as FIG. 8a) and (b) (which can be referred to as FIG. 8b)

DETAILED DESCRIPTION OF ILLUSTRATIVE EMBODIMENTS

The figures illustrating the interior structure of a semiconductor chip are simplified so as to concentrate on the components required for the further discussion. Some details which may be different when using different technologies for manufacturing the semiconductor chip have been omitted to avoid complicating the illustration.

Figure 2:
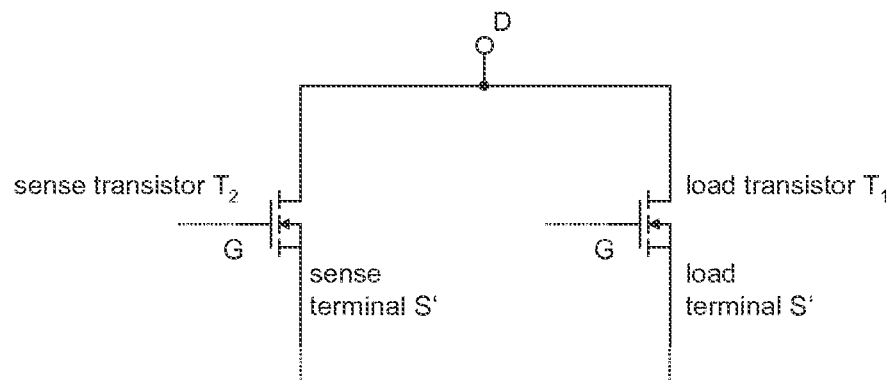
FIG. 2 is a circuit diagram illustrating the power MOS transistor and the sense transistor of FIG. 1.

FIG. 1a is a cross-sectional view illustrating (at least partially) two field effect transistor (FET) components having a common drain electrode but separated source electrodes, i.e., a power source electrode of a power transistor $T_1$ and a sense electrode of a sense transistor $T_2$ (see also FIG. 2). A plurality of transistor cells is integrated in a semiconductor body 100. From these transistor cells at least one transistor cell 101 forms the sense transistor and a multitude of transistor cells 102 form the load transistor. A (patterned) metallization layer arranged on the top surface 103 of the semiconductor body 100 (i.e., the "front side" of the semiconductor body 100) forms a power source electrode 41 which is shared by several transistor cells and electrically connected to a source terminal S of the power transistor. Another part of the metallization layer forms the sense electrode 41' which is isolated from the power source electrode 41 and forms the source electrode of the sense transistor. The individual transistor cells are defined by so-called trenches 17 which extend into the semiconductor body 100 originating from the top surface 103 of the semiconductor body 100. Gate electrodes 15 (typically made of polysilicon) are arranged within the trenches 17 and isolated from the surrounding semiconductor body 100 by means of an isolation layer 16 which is typically an oxide layer.

The semiconductor body 100 includes source regions 11, body regions 12, drift regions 13 and drain regions 14. The cell separating the load transistor and the sense transistor usually includes a body region 12' extending to the top surface 103 of the semiconductor body without an embedded source region. Source regions 11, body regions 12, and drift regions 13 may be produced using epitaxial growth, ion implantation or diffusion of doping materials dependent on the production technology used. The source regions 11 extend along the top surface 103 of the semiconductor body 100 (and essentially parallel thereto) and are directly contacted by the source electrodes 41 or 41'. The drain regions 14 extend along the bottom surface 104 of the semiconductor body 100 (i.e., the "back side" of the chip) and are directly contacted by the drain electrode 42 arranged on the bottom surface 104 of the semiconductor body 100. Between the source regions 11 and the drain regions 14 the body regions 12 as well as the drift regions 13 extend substantially parallel to the top and the bottom surfaces 103, 104 of the semiconductor 100.

The body regions 12, 12' are arranged adjacent to the trenches 17. That is, the trenches extend from the top surface 103 of the semiconductor body 100 into the semiconductor body so deep that the trench bottom reaches the corresponding drift region 13 (also referred to as "drift zone"). In an active transistor, load current flows from the source regions 11 to the drain region 14 via the corresponding body regions 12 and drift regions 13 whereby a channel 18 (only illustrated for one single cell) of charge carriers forms alongside the sidewalls of the trenches 17 under the influence of the electric field due to the charged gate electrodes 15.

An isolation layer 33 covering the trenches 17 isolates the gate electrodes 15 arranged in the trenches 17 from the source electrode 41, 41' arranged on the top surface of the semiconductor body 103.

The gate electrodes 15 are connected to a gate terminal (not shown), e.g., at one end of the trenches 17. The connection of the gate electrodes is common knowledge and thus not further described herein as it is not essential for the present discussion. Furthermore, it should be noted that the examples illustrated and discussed here are vertical transistor devices (i.e., trench transistors). However, the present invention is not limited to trench transistors and readily applicable to vertical transistors which do not have trench gates. In this context vertical transistors are MOS transistors in which the load current path (i.e., the drain-source current path) extends from the top surface to the bottom surface of the semiconductor body.

FIG. 1b is a top view corresponding to the cross section of FIG. 1a. As the source electrode of the sense transistor 41' (sense electrode) and the source electrode of the load transistor 41 (power source electrode) have to be electrically isolated from each other, the metallization forming the power source electrode 41 has a slot-shaped "cut-out" in which the sense electrode 41' is disposed in the shape of a strip-line. An isolation region 53, typically an oxide layer, is arranged between the two source electrodes 41, 41' to ensure the insulation.

FIG. 2 illustrates the transistor components 101, 102 of FIG. 1 schematically in the circuit diagram, whereby the transistor component 101 is depicted as n-MOS sense transistor $T_2$ and the load transistor component 102 is depicted as n-MOS load transistor $T_1$ in FIG. 2. The drain terminals of both transistors are necessarily connected in parallel as the transistor cells forming the transistors share a common drain electrode (see common drain electrode 42 in FIG. 1).

Figure 3:
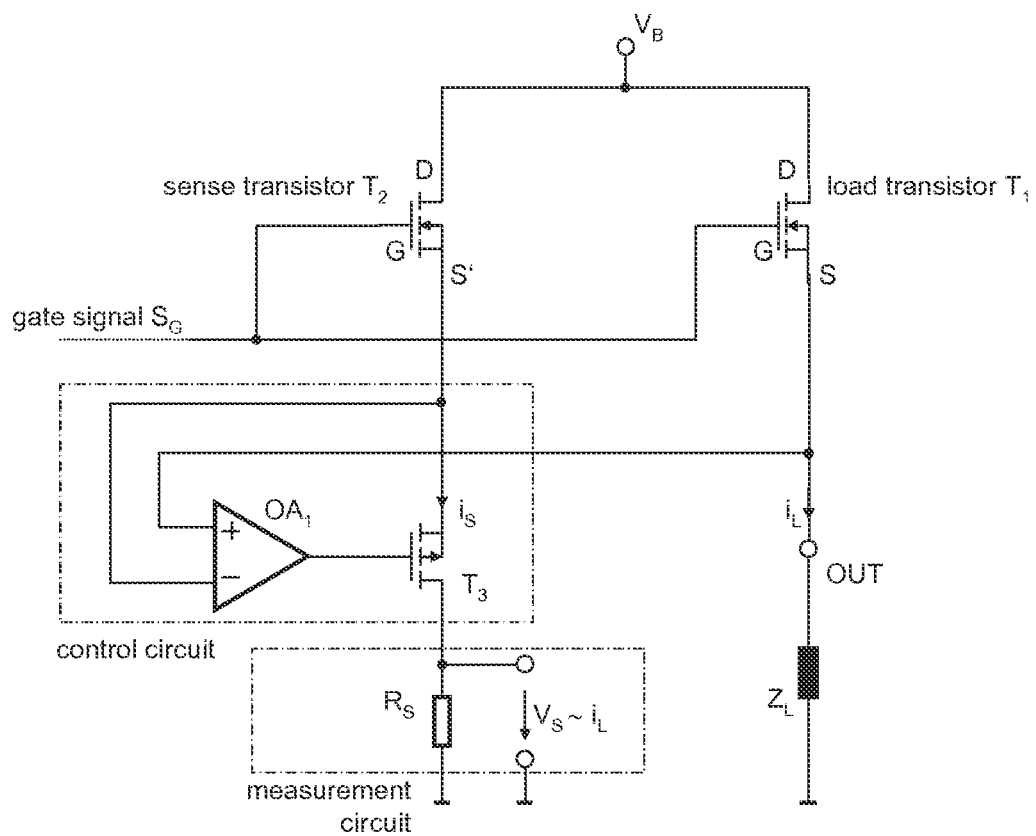
FIG. 3 is a circuit diagram illustrating one exemplary circuit to operate a sense transistor for current measurement.

FIG. 3 illustrates one application of a sense/load transistor pair (sense transistor, load transistor) as illustrated in FIG. 2. In the example of FIG. 3 the MOS transistors $T_1$, $T_2$ are n-channel MOSFETs in a high side configuration. That is, the common drain terminal D (and thus the common drain electrode, see reference numeral 42 in FIG. 1) of the sense transistor $T_2$ and the load transistor $T_1$ is connected to a high side supply potential $V_B$. Similar circuits employing p-channel MOS transistors or low-side configurations are also applicable.

In the example of FIG. 3 a load impedance $Z_L$ is connected between the source terminal S of the load transistor $T_1$ and a low side supply potential (also called reference potential which may be ground). The load transistor $T_1$ controls a load current $i_L$ supplied to the (e.g., external) load impedance $Z_L$ via output terminal OUT. The load current control is performed in accordance with a gate signal $S_G$ supplied to gate terminals G (and thus to the gate electrodes, see reference numeral 15 in FIG. 1) of the load transistor $T_1$ and the sense transistor $T_2$, respectively.

When both transistors $T_1$ and $T_2$ are operated in the same operating point (also referred to as bias point or quiescent point) a measurement current $i_S$ (also referred to as sense current) flowing through the drain-source path of the sense transistor is (approximately) directly proportional to the load current $i_L$ flowing through the drain-source current path of the load transistor. To accomplish equal operating points a control circuit is employed that is configured to regulate the source voltage of the sense transistor $T_2$ to be equal to the source voltage of the load transistor $T_1$. One example of an appropriate control circuit is illustrated in FIG. 3. Accordingly, the control circuit includes an operational amplifier $OA_1$ and a further transistor $T_3$ to regulate the source potential of the sense transistor $T_2$ so as to match with the source potential of the load transistor $T_1$. The ratio $i_S/i_L$ between the sense current $i_S$ and the load current $i_L$ is then determined by the ratio between the current conducting area of the respective transistors or, approximately, by the ratio of the number of active transistor cells of the respective transistors.

The load path (i.e., the source-drain current path) of the further transistor $T_3$ is connected in series to the load path of the sense transistor $T_2$. The gate of the further transistor $T_3$ is thereby coupled to and driven by the output of the operational amplifier $OA_1$ whose inputs are connected to the source terminals S and S' of the load transistor $T_1$ and the sense transistor $T_2$, respectively. The operational amplifier OA is configured to drive the gate of the further transistor $T_3$ such that the potential difference at its inputs approaches zero, i.e., that the source potentials of sense and source transistor $T_1$, $T_2$ are equal.

Furthermore, a measurement circuit is provided. The measurement circuit is configured to generate an output signal that is representative of the load current $i_L$. In a very simple configuration the measurement circuit includes a resistor $R_S$ connected in series to the sense transistor $T_2$ (and, if present, to the further transistor $T_3$) in order to generate a voltage drop $V_S = i_S \cdot R_S$ across the resistor $R_S$ that can be used as output signal. More complex control and measurements circuits are also known in the field and can be readily used dependent on the actual application.

Figure 4:
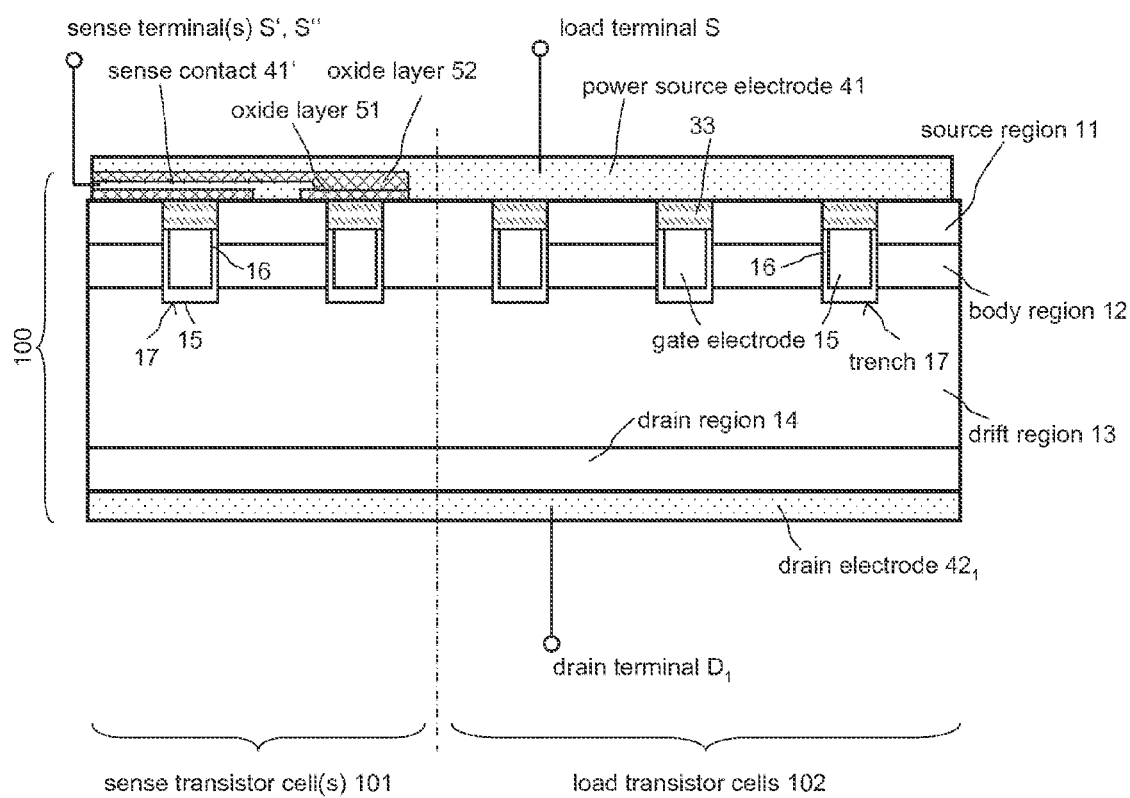
FIG. 4 is a cross sectional view of a few transistor cells of a trench transistor wherein the metallization forming the source electrode of the power transistor covers all transistor cells including those forming the sense transistor.

FIG. 4 is a cross sectional view of a sense/load transistor pair similar to the illustration of FIG. 1. The example of FIG. 4 is identical with the example of FIG. 1 wherein the only difference is the way how the sense transistor's 101 source region is contacted. Unlike in the example of FIG. 1 the metallization layer forming the source electrode 41 of the power transistor 102 extends across the whole area covering the transistor cells of both transistors, the sense transistor cells as well as the power transistors cells. The source region of the sense transistor is connected to a respective source terminal S' via a sense contact electrode 41' which is guided between the top surface 103 of the semiconductor body 100 and the metallization layer forming the source electrode 41. An oxide layer 52 is disposed between the sense contact electrode 41' and the power source electrode 41 provides electric isolation there between. The sense contact electrode 41' may be formed using a metal (e.g., tungsten) or polysilicon. The electric connection between the source terminal S' of the sense transistor and the actual source region 11 of the sense transistor is thus "shifted" to an area arranged besides the field of transistor cells forming power and sense transistor. In other words the sense current $i_S$ is guided to an area outside of the field of transistor cells forming the power and sense transistor thus improving the embedding of the sense cells into the whole sense/power transistor arrangement. As the potential of the source regions 11 of the sense transistor and of the power transistor are essentially equal, the withstand voltage of the oxide layer 52 may be comparably low.

Figure 9:
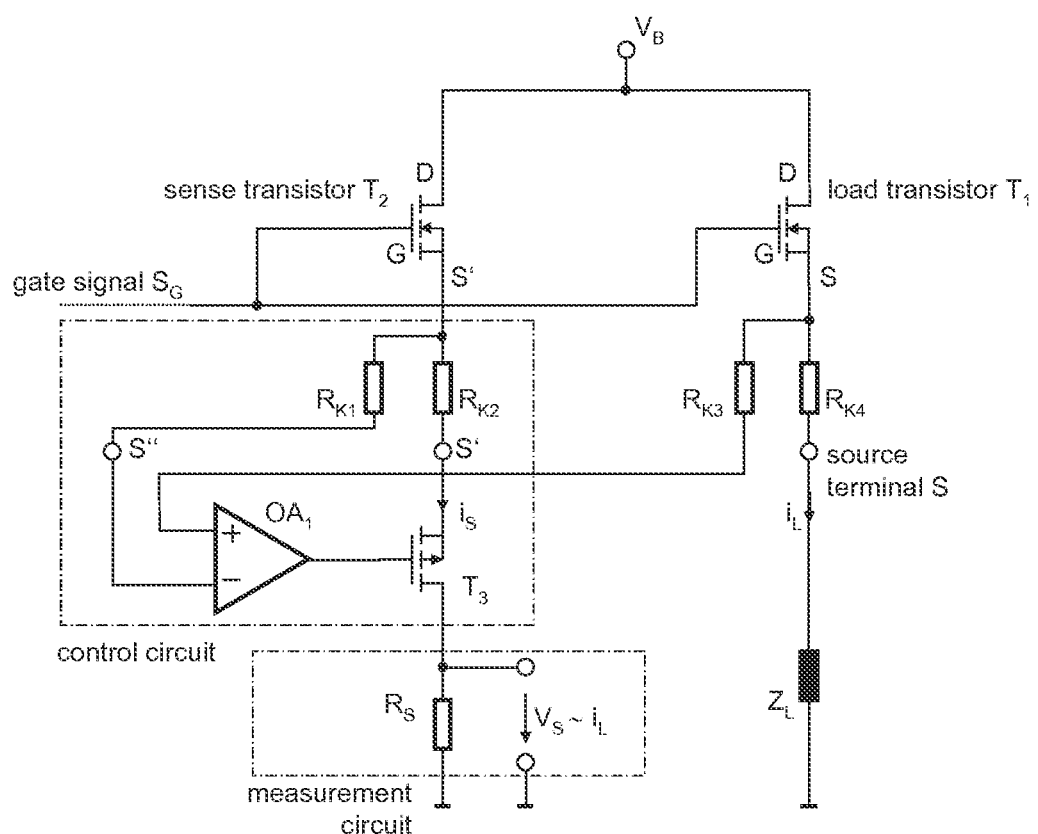
FIG. 9 is a circuit diagram illustrating the one exemplary operation of a sense/load transistor pair formed in accordance with the example of FIGS. 4 to 6.

FIG. 5 is a top view of the example of FIG. 4 wherein the metallization layer forming the power transistor's source electrode is transparent to allow a view underneath. The oxide layer 52 has also been omitted and thus the layer forming the sense contact 41' is visible. This layer may be made of, e.g., tungsten, polysilicon, metal, or the like. In case the sense contact 41' is formed using polysilicon it may doped tp be of the same type (e.g., n+-type) as the source region 11. The sense contact 41' forms the source electrode of the sense transistor and electrically couples the respective source region 11 of the sense transistor to the respective sense terminal(s) S' of the sense transistor. The illustration of FIG. 5 illustrates just a small part of the power transistor and the sense transistor, particularly parallel trenches 17 and the corresponding source regions 11 between those. The sense contact 41' may be split (forked) such that effectively two separated lines merge at the area where the electrical connection to the semiconductor body (i.e., the silicon source region 11) is established. In such a manner a kind of a so-called "four-terminal measurement" may be performed. The corresponding circuitry is illustrated in FIG. 9 and described with reference thereto further below. However, a single (not forked) line may be sufficient as a sense contact when a two-terminal measurement is sufficient.

FIG. 5 illustrates an example in which the sense contact 41' is guided to an area outside of the field of transistor cells, whereby the sense contact 41' has the form of a "strip line" extending in a transverse direction which is perpendicular to the trenches. However, in an alternative implementation, the sense contact 41' is guided alongside a trench or on top of a trench (above the gate electrode and parallel thereto, see FIG. 7). The latter example provides the advantage of even less space requirements and less impact on the current homogeneity. The sense cells (i.e., the transistor cells forming the sense transistor) can be embedded in the field of transistor cells forming the load transistor without "disturbing" the load current flow. If the sense transistor is composed of more than one sense cell the source zone of each cell may be contacted wherein one sense contact 41' may be used to contact several cells or several sense contacts may be used in parallel. In the current example, the area where the sense electrode 41' is actually in a physical contact with the surface of the silicon is denoted as contact area P. Examples for the implementation of such contacts, are described further below with reference to FIG. 9.

FIG. 6 is another cross-sectional view of the exemplary embodiment of FIGS. 4 and 5 along an axis labeled A-A' in the top view of FIG. 5 which is parallel to the trenches 17. Clearly visible is the "buried" sense contact 41' which is arranged beneath the top surface of the metallization layer forming the source electrode 41 of the power transistor and electrically isolated therefrom by the oxide layers 51 and 52. The further structure of the semiconductor body 100 corresponds to the illustration of FIG. 4 which is a cross sectional view along an axis perpendicular to the axis A-A'. Both FIGS. 5 and 6 the contact area P indicates where the sense contact (i.e., the source electrode of the sense transistor) is electrically connected to the respective source region 11 in the semiconductor body. As mentioned above one source contact may be electrically connected to more than one source region 11 of more than one respective sense cells (e.g., contact areas P and P' as shown in FIG. 5). Further examples of different source-contacts are illustrated in FIGS. 8a and 8b.

FIG. 7 is an alternative to the example illustrated in FIG. 5. In this exemplary implementation the sense contact 41' is guided alongside a trench or on top of a trench (above the gate electrode and parallel thereto) which provides the advantage of even less space requirements and less impact on the current homogeneity. As one advantage the contact area between the power source metallization and the power transistor cells is not interrupted by transversal sense contact lines (as shown in FIG. 5). Similar to the example of FIG. 5 the area in which an electric contact between the sense electrode 41 and the chip surface is actually established is denoted as contact area P. Again, the sense electrode is forked into two branches, one branch (with resistance $R_{K2}$) for sinking the sense current and another branch (with resistance $R_{K1}$) for tapping the source potential. As already mentioned the two branches allow for a kind of four-terminal measurement, i.e., the voltage drop across the resistance $R_{K2}$ due to the sense current is avoided by tapping the source voltage (nearly current-less) using the second branch with resistance $R_{K1}$. The two branches of the sense electrode 41' may be guided on top of the trenches 17 thus minimizing the space requirements for the source electrodes and further minimizing the "disturbance" introduced in the power transistor cell field. Examples of how the contact between the sense transistor cell and the sense electrode can be achieved are illustrated in FIGS. 8a and 8b.

FIG. 8a illustrates a so-called "shallow contact" whereas FIG. 8b shows a "groove contact". In the following the process of manufacturing the sense electrode 41' and the power source electrode 41 is described, wherein a semiconductor body 100 including transistor cells for the power transistor and the load transistor 101 and 102 (see also FIG. 1) is provided using any common semiconductor manufacturing process. An oxide layer 51 is then formed on the top surface of the semiconductor body 100.

If a shallow contact is to be formed (FIG. 8a) then the oxide layer 51 is opened in the contact area where the sense electrode 41' should provide an electrical contact to the semiconductor body. Subsequently, polycrystalline silicon (polysilicon) is deposited on top of the oxide layer 51 to form the sense electrode 41'. The semiconductor body 100 is only contacted in that area(s) where the oxide has been opened before. Finally, a further oxide layer 52 is deposited to cover the sense electrode 41', and the power source electrode 41 is deposited on top of the oxide layer 52 to cover both the sense transistors cells and the power transistors cells. In areas aside the sense transistor cells the power source electrode 41 contacts the power transistor cells via respective openings in the oxide layers.

If a grove contact is to be formed (FIG. 8b) then the oxide layer 51 is opened in the contact area(s) where the sense electrode 41' and the power electrode 41 should provide an electrical contact to the semiconductor body. Subsequently, the grooves are etched in the contact areas P (see FIG. 7) within the sense transistors cells and the power transistor cells in one etching step. To contact the sense cells, polysilicon is deposited in the grooves etched in the sense cells thus establishing an electrical contact to the semiconductor body and forming the sense electrode 41'. Finally, a further oxide layer 52 is deposited to cover the sense electrode 41', and the power source electrode 41 is deposited on top of the oxide layer 52 to cover both the sense transistors cells and the power transistors cells. In areas aside the sense transistor cells the power source electrode 41 contacts the power transistor cells via the respective groves in the power transistors cells (which have not been filled with polysilicon).

The sense electrode 41' as well as the power electrode 41 provides direct electric contact to the semiconductor body without the need for forming vias through any metallization layers. An optimum embedding of the sense cells is achieved without "disturbing" the homogeneous current flow through the power transistors cells.

FIG. 9 is a circuit diagram illustrating a circuit which may be used to ensure that the potentials of the source electrodes of the load and sense transistor $T_1$, $T_2$ are equal so as to accomplish the strict proportionality between the load current $i_L$ and the sense current $i_S$. The circuit of FIG. 9 is essentially the same as the circuit of FIG. 3. However, FIG. 9 includes the line resistances $R_{K1}$, $R_{K2}$, $R_{K3}$, $R_{K4}$ which have been neglected in the circuit of FIG. 3. The resistance $R_{K4}$ represents the resistance of the whole current path from the silicon source regions 11 of the power transistor $T_1$ to the external source terminal S. The resistance $R_{K3}$ represents the resistance of the current path from the silicon source regions 11 of the power transistor $T_1$ to a second external source terminal (not illustrated) which is used only for measuring the source potential of the load transistor $T_1$. The resistance $R_{K4}$ carries the whole load current $i_L$ whereas the resistance $R_{K3}$ carries substantially no current as the control or measurement circuit(s) coupled thereto usually have very high input impedances. The situation is similar for the sense transistor $T_2$. The resistance $R_{K2}$ represents the resistance of the current path from the silicon source region 11 of the sense transistor $T_2$ to an external source terminal S' which is used to tap the sense current $i_S$. The resistance $R_{K1}$ represents the resistance of the current path from the silicon source region 11 of the sense transistor $T_2$ to another source S'' terminal which is used to tap the source potential of the sense transistor. The resistance $R_{K2}$ carries the whole sense current $i_S$ whereas the resistance $R_{K1}$ carries substantially no current like the resistance R. The resistances $R_{K1}$ and $R_{K2}$ (or parts thereof) are also illustrated in FIG. 5. By using designates resistances $R_{K1}$, $R_{K3}$ for sensing the source potentials without sinking any current a four-terminal potential measurement is accomplished which allows a precise measurement of the source potential difference avoiding the impact of the voltage drops $R_{K4}i_L$ and $R_{K2}i_S$ across the contact-circuit resistances $R_{K4}$ and $R_{K2}$.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A semiconductor device comprising:
   a semiconductor body;
   a field of transistor cells integrated in the semiconductor body, a plurality of the transistor cells forming a power transistor and at least one of the transistor cells forming a sense transistor, wherein the plurality of the transistor cells forming the power transistor are connected in parallel;
   a first source electrode arranged on the semiconductor body electrically connected to the transistor cell(s) of the sense transistor but electrically isolated from the plurality of the transistor cells forming the power transistor; and
   a second source electrode arranged on the semiconductor body and covering the transistor cells of both the power transistor and the sense transistor, and at least partially covering the first source electrode in such a manner that the second source electrode is electrically connected only to the plurality of the transistor cells forming the power transistor but electrically isolated from the transistor cell(s) of the sense transistor.

2. The semiconductor of claim 1, wherein the second source electrode provides direct electric contact to the transistor cells forming the power transistor without requiring vias through other electrode layers or metallization layers.

3. The semiconductor device of claim 1, further comprising an insulation layer arranged between the first electrode and the second electrode to electrically insulate the first and second electrodes.

4. The semiconductor device of claim 1, wherein the first source electrode has a shape of a strip line that is guided to an area besides the field of transistor cells forming the power and the sense transistor.

5. The semiconductor device of claim 4, wherein the transistor cells are divided by gate electrodes and wherein the strip line shaped first source electrode is guided alongside the gate electrodes or perpendicular thereto.

6. The semiconductor device of claim 4, wherein the transistor cells are divided by trenches that include gate electrodes and wherein the strip line shaped first source electrode is guided on top of the trenches.

7. The semiconductor device of claim 4, wherein the transistor cells are separated by trenches that include gate electrodes and wherein the strip line shaped first source electrode extends alongside at least one of the trenches.

8. The semiconductor device of claim 1, wherein the first source electrode is forked into first and second parts to provide separate contacts for sinking source current and tapping source potential, respectively.

9. The semiconductor device of claim 8, wherein the first and the second part of the first source electrode are connected to respective first and second external source terminals at a position besides the field of transistor cells forming the sense and the power transistor.

10. The semiconductor device of claim 9, wherein the first and the second part of the first source electrode join at a contact area at which the electrode is electrically connected to a source region of a transistor cell.

11. The semiconductor device of claim 1, wherein the first source electrode and the second source electrode are arranged on a top surface of the semiconductor body and wherein the semiconductor device further comprises a common drain electrode for the source and the sense transistor, the common drain electrode being arranged on a bottom surface of the semiconductor body.

12. The semiconductor device of claim 11, wherein the semiconductor body includes a drain region extending along the bottom surface, a body region extending along the top surface, a drift region arranged between the drain region and the body region, and source regions embedded in the body regions, each source region being associated with a transistor cell and contacted either by the first source electrode or by the second source electrode.

13. A method for manufacturing a device, the method comprising:
providing a semiconductor body that comprises a field of transistor cells integrated therein, a plurality of the transistor cells forming a power transistor and at least one of the transistor cells forming a sense transistor, wherein the plurality of the transistor cells forming the power transistor are connected in parallel;
forming a first source electrode on the semiconductor body such that it is electrically connected to the transistor cell(s) of the sense transistor but electrically isolated from the plurality of the transistor cells forming the power transistor; and
forming a second source electrode on the semiconductor body such that it covers the transistor cells of both the power transistor and the sense transistor and at least partially covers the first source electrode in such a manner that the second source electrode is electrically connected only to the plurality of the transistor cells forming the power transistor but electrically isolated from the transistor cell(s) of the sense transistor.

14. The method of claim 13, wherein forming the first source electrode comprises:

forming a first oxide layer on the semiconductor body
selectively open the first oxide layer at positions where transistor cell(s) of the sense transistor are to be contacted;
depositing first electrode material; and
patterning the first source electrode.

15. The method of claim 14, wherein the first electrode material comprises polysilicon or a metal.

16. The method of claim 14, wherein forming the second source electrode comprises:
forming a second oxide layer;
opening the second oxide layer at positions where the transistor cells forming the power transistor are to be contacted; and
depositing a metal as second electrode material, wherein the second oxide layer provides isolation between the first source electrode and the second source electrode.

17. The semiconductor device of claim 1, wherein drain electrodes of the power transistor and the sense transistor are electrically connected.

18. The semiconductor device of claim 1, wherein the sense transistor is configured to sense a current.

19. A semiconductor device comprising:
a semiconductor body;
a field of transistor cells integrated in the semiconductor body, a plurality of the transistor cells forming a power transistor and at least one of the transistor cells forming a sense transistor, wherein drain electrodes of the power transistor and the sense transistor are electrically connected;
a first source electrode arranged on the semiconductor body electrically connected to the transistor cell(s) of the sense transistor but electrically isolated from the plurality of the transistor cells forming the power transistor; and
a second source electrode arranged on the semiconductor body and covering the transistor cells of both the power transistor and the sense transistor, and at least partially covering the first source electrode in such a manner that the second source electrode is electrically connected only to the plurality of the transistor cells forming the power transistor but electrically isolated from the transistor cell(s) of the sense transistor.

20. The semiconductor of claim 19, wherein the second source electrode provides direct electric contact to the transistor cells forming the power transistor without requiring vias through other electrode layers or metallization layers.

21. The semiconductor device of claim 19, further comprising an insulation layer arranged between the first electrode and the second electrode to electrically insulate the first and second electrodes.

22. The semiconductor device of claim 19, wherein the first source electrode is forked into first and second parts to provide separate contacts for sinking source current and tapping source potential, respectively.

23. The semiconductor device of claim 22, wherein the first and the second part of the first source electrode are connected to respective first and second external source terminals at a position besides the field of transistor cells forming the sense and the power transistor.

* * * * *